United States Patent
Rahbar

(10) Patent No.: US 8,599,986 B2
(45) Date of Patent: Dec. 3, 2013

(54) PHASE LOCKED LOOP WITH OPTIMAL STATE FEEDBACK CONTROLLER

(75) Inventor: Kamran Rahbar, Kanata (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 943 days.

(21) Appl. No.: 12/605,974

(22) Filed: Oct. 26, 2009

(65) Prior Publication Data

US 2010/0166130 A1 Jul. 1, 2010

(30) Foreign Application Priority Data

Dec. 31, 2008 (GB) .................................... 0823690.3

(51) Int. Cl.
*H03D 3/24* (2006.01)
(52) U.S. Cl.
USPC ............................. 375/375; 375/376; 375/327
(58) Field of Classification Search
USPC .......................................... 375/375, 376, 327
See application file for complete search history.

(56) References Cited

U.S. PATENT DOCUMENTS

| 5,062,123 | A | * | 10/1991 | Geile et al. | ..................... 375/327 |
| 5,602,884 | A | | 2/1997 | Wieczorkiewicz et al. | |
| 7,130,368 | B1 | * | 10/2006 | Aweya et al. | ................. 375/376 |
| 7,333,468 | B1 | * | 2/2008 | Turullols et al. | ............. 370/349 |
| 2002/0070811 | A1 | | 6/2002 | Skierszkan | |
| 2007/0291777 | A1 | * | 12/2007 | Jamieson et al. | ............. 370/401 |

FOREIGN PATENT DOCUMENTS

| WO | 2007061370 A1 | 5/2007 |
| WO | 2008/051123 A1 | 5/2008 |

* cited by examiner

*Primary Examiner* — Daniel Washburn
*Assistant Examiner* — Qutbuddin Ghulamali
(74) *Attorney, Agent, or Firm* — Marks & Clerk; Richard J. Mitchell

(57) ABSTRACT

In a method of recovering timing information over a packet network at a local receiver, timing information is received at intervals timing from a remote source and compared with a locally generated clock signal to generate an input signal y(k) subject to noise representative of the phase difference between the source clock signal and the local receiver clock signal. The input signal is applied to a state feedback controller, preferably including a Kalman filter, to generate a control signal with reduced noise. The control signal is used to control an oscillator in a way so as to reduce the phase difference and generate a slave clock.

10 Claims, 3 Drawing Sheets

PHASE LOCKED LOOP WITH OPTIMAL STATE FEEDBACK CONTROLLER

FIELD OF THE INVENTION

This invention relates to the field of clock recovery over packet networks, an in particular to a phase locked loop with a feedback controller and a method of recovering timing information.

BACKGROUND OF THE INVENTION

A phase locked loop can be considered as a feedback loop control system which closely tracks a reference clock input. A typical PLL structure is shown in FIG. 1. As can been in the figure the difference between a reference clock and digitally controlled oscillator (DCO) is fed to a loop filter, which is basically a proportional/integral (PI) controller. The output of the loop filter then is used to steer the output phase of the DCO such that it closely tracks the reference clock input phase.

The loop filter parameters (P and I) are designed to meet certain performance requirements, such as band-width, initial locking time, dynamic tracking etc. For example, when the input reference clock is contaminated with jitter and wander, the filter bandwidth is set to minimize the effect of jitter or wander on the reference input. Lowering the loop filter bandwidth to improve wander and jitter elimination will have a adverse effect on how fast PLL can track reference input signal. In practice, a trade-off is required between tracking the input phase and rejecting wander and jitter.

Recently there has been much interest in clock synchronization over packet networks, where, as shown in FIG. 2, reference clock phase information is transmitted through dedicated timing packets by a server over a packet switched network (PSN). At the other end of the network, a client synchronizes its clock with the server using the timing packets. This method can be used to synchronize systems that are connected through a packet network, such as wireless basestations.

One of the main challenges in this synchronization approach is that the timing packets are most likely subjected to packet delay variations (PDV) inherent in any packet switched network. As a result, at the client side, depending on the packet delay variations, the recovered reference clock will have a high level of jitter and wander, which for most applications will not be acceptable.

A traditional PLL system is not able to remove jitter and wander in this case because the simple loop filter in a traditional PLL cannot handle a high level of jitter and wander. To be able to remove substantial amounts of wander, the loop filter should be set to very low frequencies. This requires the use of very stable local oscillators at the server or at the client side, which may not be cost effective or practical.

Also, the network PDV has a non-stationary nature, which results in rapid or slow movement of recovered phase at the client side. Traditional PLLs are not designed to handle non-stationary noise.

In addition, systems for timing recovery over packets networks are time varying in nature. Traditional PLLs are designed for time-invariant systems and are not suited for this kind of application.

A PLL is single-input single-output system designed to lock its output phase to a single input clock reference and cannot directly be applied to the case when multiple timing packet streams are traceable to the same primary reference clock (PRC).

To be able to handle some of these shortcomings of the classic PLL for timing recovery over packet networks, the prior art suggests using a two stage scheme with the first stage being a packet filter which only selects timing packets that have least amount of packet delay variations and the second stage being normal PLL such as the one shown in FIG. 1. The main problem with this approach is that the performance of the clock recovery algorithm relies greatly on the number of filtered timing packets. When there are very few or none of these so-called minimum delayed timing packets available, the algorithm may fail to recover or track the server clock. There are also other methods based, e.g., on averaging the timing packets but these methods also suffer from poor performance when dealing with larger packet delay variations.

None of the prior art offers an optimal scheme that can exploit the space diversity of packet networks when there are two or more timing packet streams.

SUMMARY OF THE INVENTION

The invention offers a new approach for timing recovery over packets networks that is based on a powerful concept in control theory known as the state feedback controller.

According to one aspect of the invention there is provided a method of recovering timing information over a packet network at a local receiver, comprising receiving at intervals timing information about a remote source clock signal; generating a local clock signal with a controlled oscillator; comparing the local timing signal with the received timing information to generate a noisy input signal $y(k)$ representative of the phase difference between the source clock signal and the local receiver clock signal; applying said input signal $y(k)$ to a state feedback controller to generate a control signal with reduced noise; and controlling said controlled oscillator with said control signal to reduce said phase difference and generate a slave clock signal from said remote clock signal.

In one embodiment, an optimal adaptive state estimator, known as a Kalman filter, is used to estimate the internal states of the timing recovery system.

The main advantages of proposed method compared to the prior art are better performance (phase tracking, locking time etc.) especially for high level of jitter and wander. Contrary to traditional PPL approaches, the current method can be applied to time-invariant or time-varying systems, and when there are two or more timing packet streams traceable to same PRC, rather than switching between streams, the proposed method can exploit the diversity of streams to provide optimal output performance.

According to another aspect of the invention there is provided a phase locked loop for recovering timing information over a packet network at a local receiver, comprising a controlled oscillator for generating a slave signal in response to a control signal; a phase comparator for comparing timing information received from a remote source with the slave signal to generate a noisy input signal; and a state feedback controller for generating a cleaned control signal from the noisy input signal.

According to yet another aspect of the invention there is provided a timing recovery apparatus for recovering timing information over a packet network at a local receiver, comprising an input for receiving remote time stamped packets from a remote source over the packet network; a local controlled oscillator for generating a slave clock in response to a cleaned control signal; a generator for generating local time stamped packets based on said slave clock and coinciding with the arrival of time stamped packets from the source; a comparator for comparing said time stamped packets received from the source with the locally generated time stamped packets to derive said input signal; and a state feedback controller for generating said cleaned control signal from said input signal.

BRIEF DESCRIPTION OF THE DRAWINGS

The invention will now be described in more detail, by way of example only, with reference to the accompanying drawings, in which: —

DETAILED DESCRIPTION OF THE PREFERRED EMBODIMENTS

The invention provides a method for phase and frequency locking when the reference clock phase information is transmitted through a packet switched network. The method is based on the use of state feedback control, where a linear combination of estimated states of a linear system is fed back into system to control its output. The main advantage of the proposed approach is its ability to handle higher level of wander on the reference clock, faster acquisition mode and better tracking. Additionally it can easily be extended to the case when there are multiple input clock streams (traceable to same primary reference) for better output performance.

Figure 1:
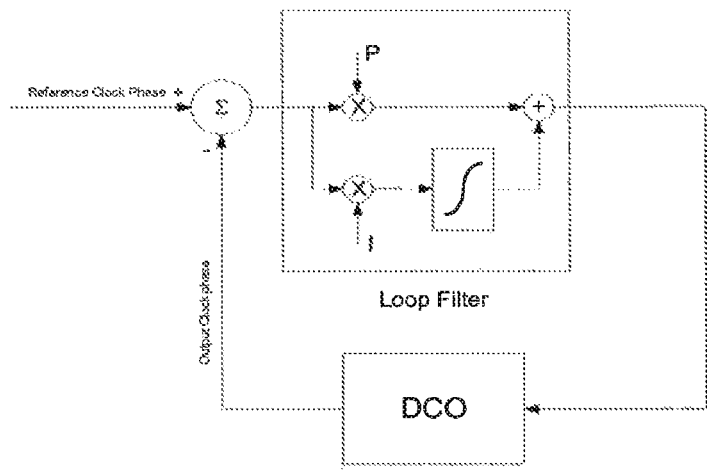
FIG. 1 is a block diagram of prior art phase locked loop.
Figure 2:
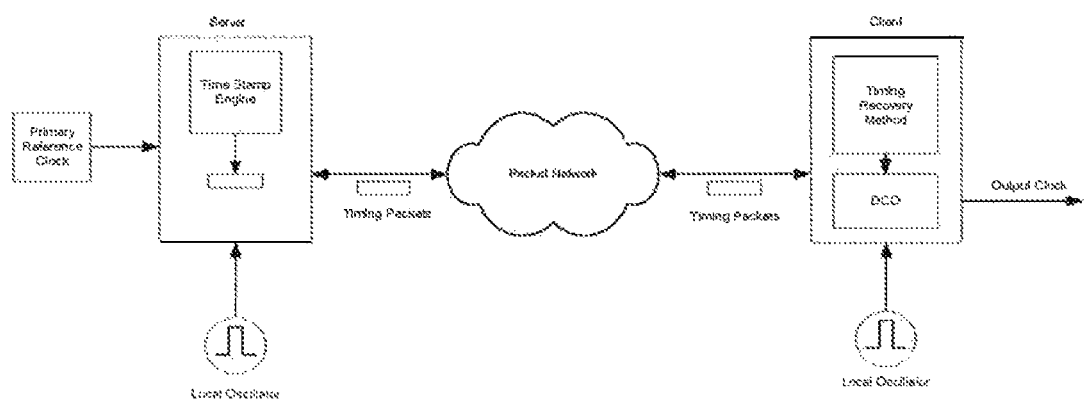
FIG. 2 is a high level block diagram of a timing recovery system for packet networks.
Figure 3:
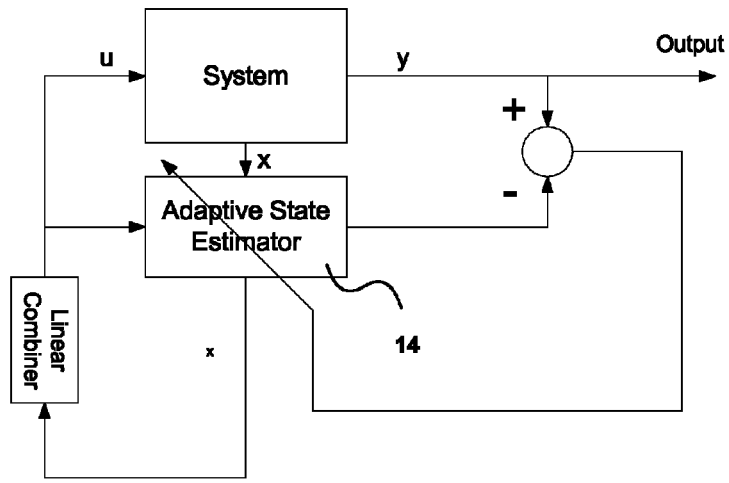
FIG. 3 is block diagram of a state-feedback controller.

The basic concept behind a state feedback controller, as shown in FIG. 3, is that given a system with input u and output y, one can control the output y to meet a desired behaviour by feeding a linear combination of system internal states back to the input of the system. In practice, the internal states of a system are not known before hand, and an adaptive state estimator is used to compute internal states of the system.

Figure 4:
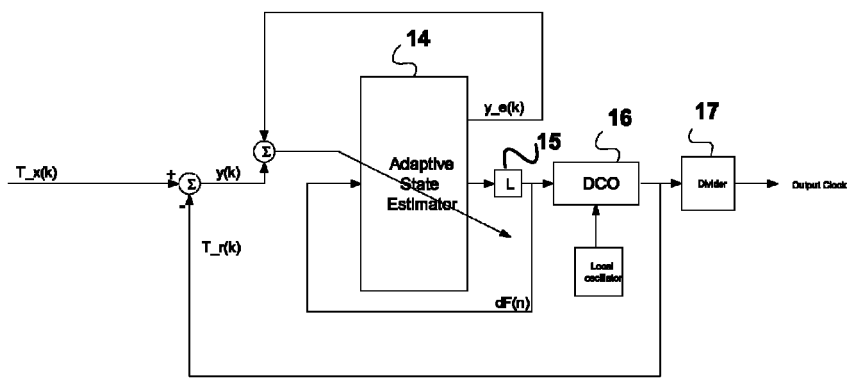
FIG. 4 is a high level block diagram of a timing recovery system in accordance with one embodiment of the present invention.

FIG. 4 is a high level block diagram of a clock recovery system including the adaptive state estimator 14, linear combiner 15, digital controlled oscillator (DCO) 16, and divider 17, local oscillator 18, and subtractor 19, which serves as a comparator comparing incoming time stamps with locally generated time stamps.

The inputs to the system are server time-stamps from the remote source, which are transmitted by the server at regular or irregular time intervals and based on the local clock at the source. At the client side, the digital controlled oscillator (DCO) hardware 16 driven by the local oscillator 18 generates local time stamps based on arrival time of server time stamps. The difference between the server and local time stamps, determined in subtractor/comparator 19, represents the phase difference between the local and server clocks. Due to packet delay variations, inherent to packet switched networks, the measured phase difference at client side will be highly contaminated with network noise. The adaptive state estimator 14 estimates the clean phase difference between the server and client clocks based on the noisy input data y(k). It also estimates the frequency offset between client and server clocks. A linear combination of these two estimated parameters then is used to control client DCO to minimize the phase difference between client and server output clocks.

A more detailed description of the invention will be made by reference to FIG. 5, which contains a number of processing blocks. These processing blocks can be implemented directly in hardware, or by a digital signal processor or general purpose computer. The following notation is employed:

n is index to packet number.

$T_x(n)$ represents server time stamp for packet n $T_r(n)$ represents output of the DCO for packet n.

y(n) is the transit time and represents difference between server time stamp and DCO output for packet n $dF(t_n)$ represents DCO update value at time $t_n$.

$\hat{\alpha}_n$ represents estimated frequency offset between server and client at the time that n_th packet arrived.

$\hat{\Omega}_n$ represents estimated phase offset between server and client at the time n_th packet arrived.

$\Delta T_x(n)$ represents the difference between two consecutive transmit time stamps, defined as $$\Delta T_x(n) = T_x(n) - T_x(n-1)$$

$v_n$ represents the amount of network jitter experienced $n_{th}$ packet.

As discussed above, the present invention is based on the use of a state feedback controller where the internal states (phase and frequency offset) estimated by an adaptive state estimator are fed back to a DCO 16 to control the output phase of local salve clock. The state space description for the timing recovery system of this embodiment can be written as:

$$x_n = F_{n-1} \cdot x_{n-1} + G_n \cdot u_n + w_n$$

and $$y(n) = H_n \cdot x_n + v_n$$

where
y(n) is the measured transit time given by:

$$y(n) = T_x(n) - T_r(n),$$

$$F_{n-1} = \begin{bmatrix} 1 & \Delta T_x(n-1) \\ 0 & 1 \end{bmatrix}$$

is the state transition matrix, $$x_n = \begin{bmatrix} \Omega(n) \\ \alpha_n \end{bmatrix}$$

is the timing recovery system state vector, $H_n = [1 \, \Delta T_x(n)]$ is the measurement matrix for this system and $$G_n = \begin{bmatrix} \Delta T_x(n) \\ 0 \end{bmatrix}$$

is input vector matrix, and $w_n$ is the variance vector of the process noise.

The preferred linear method to estimate the state vector $x_n$ is a Kalman filter.

Figure 5:
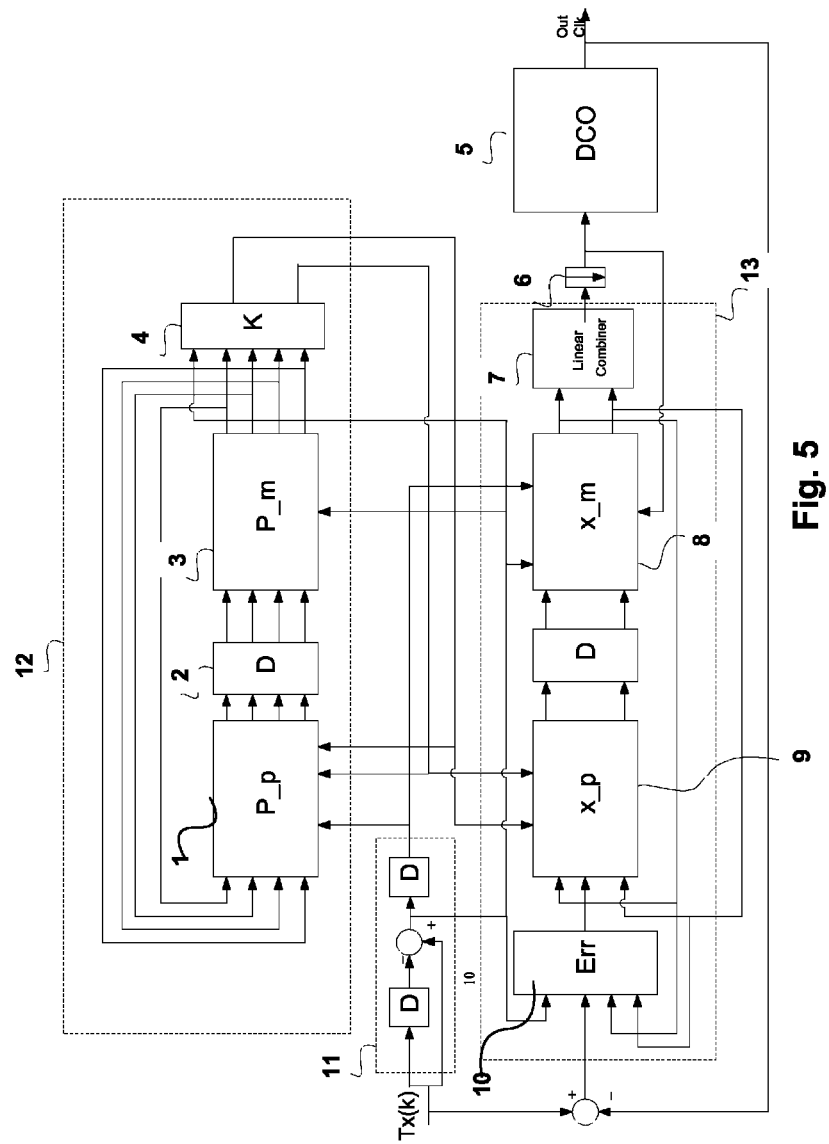
FIG. 5 is a detailed block diagram of an embodiment of a timing recovery system in accordance with the invention

In the embodiment of FIG. 5, the blocks 11, 12 and 13 constitute the Kalman filter that calculates the update value for the DCO 16 based on a linear combination of outputs of 8, which is Kalman filters's a-posteriori estimate of the state vector $x_n$. Block 6 is a decimator that controls the ratio between input sample-rate to the DCO 16 and the output sample-rate of the linear combiner 7. Block 2 is a delay unit for delaying the input by one sample.

The outputs of the combiner 7 are given by the expression $$\Delta f = \alpha x_{m1} + \beta x_{m2}$$

where $0 < \alpha \ll \beta < 1$ are constants, $x_{m1}$ and $x_{m2}$ are outputs of the block, which are calculated in accordance with the expression $$x_{m1}(n) = x_{p1}(n-1) + \Delta T_x(n-1) x_{p2}(n-1) - dF(t_n)\Delta T_x(n)$$

$$x_{m2}(n) = x_{p2}(n-1)$$

where $\Delta T_x(n)$ is difference between two consecutive server times tamps and is calculated in block 11 with its output given by the expression $$\Delta T_x(n) = T_x(n) - T_x(n-1)$$

$x_{p1}$ and $x_{p2}$ are outputs of the block 9, which are the Kalman filter's a-priori estimates of the state vector and are given by $$x_{p1}(n) = x_{m1}(n) + K_1(n) err$$

$$x_{p2}(n) = x_{m2}(n) + K_2(n) err$$

err is the output of block 10 and is calculated from the expression $$err = y(n) - x_{m1}(n) - \Delta T_x(n) x_{m2}(n)$$

$K_1$ and $K_2$ are the Kalman filter gains and are calculated by block 4 based on following equations:

$$K_1(n) = \frac{(P_{m1}(n) + \Delta T_x(n) P_{m2}(n))}{(P_{m1}(n) + \Delta T_x(n)[P_{m2}(n) + P_{m3}(n)] + \Delta T_x^2(n) P_{m4}(n) + \sigma)}$$

$$K_2(n) = \frac{(P_{m3}(n) + \Delta T_x(n) P_{m4}(n))}{(P_{m1}(n) + \Delta T_x(n)[P_{m2}(n) + P_{m3}(n)] + \Delta T_x^2(n) P_{m4}(n) + \sigma)}$$

$\sigma > 0$ constant and can be set based on the network PDV. $P_{m1} \ldots P_{m4}$ are elements of the Kalman filter's a-posteriori covariance matrix, calculated by block 3, based on following equations.

$$P_{m1}(n) = P_{p1}(n-1) + \Delta T_x(n-1)[P_{p2}(n-1) + P_{p3}(n-1)] + \Delta T_x^2(n-1) P_{p4}(n) + \delta_1$$

$$P_{m2}(n) = P_{p2}(n-1) + \Delta T_x(n-1) P_{p4}(n-1)$$

$$P_{m3}(n) = P_{p3}(n-1) + \Delta T_x(n-1) P_{p4}(n-1)$$

$$P_{m4}(n) = P_{p4}(n-1) + \delta_2$$

$\delta_1 > 0$ and $\delta_2 > 0$ are constants that are set based on desired tracking behaviour of Kalman filter and $P_{p1} \ldots P_{p4}$ are elements of Kalman filter's a-priori state covariance matrix, calculated by block 1, based on following set of equations:

$$P_{p1}(n) = P_{m1}(n) - K_1(n)(P_{m1}(n) + \Delta T_x(n) P_{m3}(n))$$

$$P_{p2}(n) = P_{m2}(n) - K_1(n)(P_{m2}(n) + \Delta T_x(n) P_{m4}(n))$$

$$P_{p3}(n) = P_{m3}(n) - K_2(n)(P_{m1}(n) + \Delta T_x(n) P_{m3}(n))$$

$$P_{p4}(n) = P_{m4}(n) - K_2(n)(P_{m2}(n) + \Delta T_x(n) P_{m4}(n))$$

In an alternative embodiment, where N input timing packets streams are available (from N servers traceable to the same primary reference clock), the invention can be extended to exploit these multi-streams and provide better performance. The state-space equation for N clock streams is similar to the equations given above for a single stream with following differences.

$$y_n = \begin{bmatrix} y_1(n) \\ \ldots \\ y_N(n) \end{bmatrix}$$

where $y_1(n) \ldots y_N(n)$ are transit times collected from N streams, $$x_n = \begin{bmatrix} \Omega_1(n) \\ \Omega_2(n) \\ \ldots \\ \Omega_N(n) \\ \alpha_n \end{bmatrix}$$

where $\Omega_1(n) \ldots \Omega_N(n)$ represent the estimated phase for each stream and $\alpha_n$ is the frequency offset between the client local oscillator and the primary reference clock. For multi stream timing packets, the measurement matrix and state transition matrix are respectively $$H_n = \begin{bmatrix} 1 & 0 & \ldots & 0 & \Delta T_{x1}(n) \\ 0 & 1 & 0 & \ldots & \Delta T_{x2}(n) \\ \ldots & \ldots & \ldots & \ldots & \ldots \\ 0 & 0 & \ldots & 1 & \Delta T_{xN}(n) \end{bmatrix}$$

$$F_{n-1} = \begin{bmatrix} 1 & 0 & \ldots & 0 & \Delta T_{x1}(n-1) \\ 0 & 1 & 0 & \ldots & \Delta T_{x2}(n-1) \\ \ldots & \ldots & \ldots & \ldots & \ldots \\ 0 & 0 & \ldots & 1 & \Delta T_{xN}(n-1) \\ 0 & 0 & 0 & \ldots & 1 \end{bmatrix}$$

Based on this new system model a Kalman filter formulation can be derived that can recursively estimate the state vector $x_n$. In a manner similar to the one-stream case, a linear combination of the estimated state vector can be used to control output phase of the DCO.

It will thus be appreciated that the invention employs a state-space model for clock recovery over packet networks using a state-feedback controller for improved phase and frequency locking, The invention can easily be extended to multiple input clock streams.

The invention claimed is:
1. A method of recovering timing information over a packet network at a local receiver, comprising:
receiving at intervals timing information about a remote source clock signal;
generating a local clock signal with a controlled oscillator;
comparing the local timing signal with the received timing information to generate noisy input signal y(k) representative of the phase difference between the source clock signal and the local receiver clock signal;
applying said input signal y(k) to a state feedback controller to generate a control signal with reduced noise; and
controlling said controlled oscillator with said control signal to reduce said phase difference and generate a slave clock signal from said remote clock signal;
wherein an adaptive state estimator computes estimated internal states of said state feedback controller, said internal states respectively representing phase and frequency offset, and wherein said control signal is derived from a combination of said computed internal states, said adap- tive state estimator being a Kalman filter wherein the state space description of said Kalman filter is given by $$x_n = F_{n-1} \cdot x_{n-1} + G_n \cdot u_n + w_n$$

and $$y(n) = H_n \cdot x_n + v_n$$

where y(n) is the measured transit time given of timing signals through the network, $F_{n-1}$ is the state transition matrix, $x_n$ is the timing recovery system state vector, $H_n$ is the measurement matrix, $G_n$ is the input matrix, $u_n$ is an input, $v_n$ represents the amount of network jitter, $w_n$ is the variance vector of the process noise.

2. A method as claimed in claim 1. wherein said combination is a linear combination.

3. A method as claimed in claim 1, wherein timing information is received from multiple input source clocks, and the state-space for the Kalman filter is given by:

$$y_n = \begin{bmatrix} y_1(n) \\ \dots \\ y_N(n) \end{bmatrix}$$

where $y_1(n) \dots y_N(n)$ are transit times collected from N streams, $$x_n = \begin{bmatrix} \Omega_1(n) \\ \Omega_2(n) \\ \dots \\ \Omega_N(n) \\ \alpha_n \end{bmatrix}$$

where $\Omega_1(n) \dots \Omega_N(n)$ represent the estimated phase for each stream and $\alpha_n$ is the frequency offset between the client local oscillator and the primary reference clock;

for multi stream timing packets, the measurement matrix and state transition matrix are respectively $$H_n = \begin{bmatrix} 1 & 0 & \dots & 0 & \Delta T_{x1}(n) \\ 0 & 1 & 0 & \dots & \Delta T_{x2}(n) \\ \dots & \dots & \dots & \dots & \dots \\ 0 & 0 & \dots & 1 & \Delta T_{xN}(n) \end{bmatrix}$$

and $$F_{n-1} = \begin{bmatrix} 1 & 0 & \dots & 0 & \Delta T_{x1}(n-1) \\ 0 & 1 & 0 & \dots & \Delta T_{x2}(n-1) \\ \dots & \dots & \dots & \dots & \dots \\ 0 & 0 & \dots & 1 & \Delta T_{xN}(n-1) \\ 0 & 0 & 0 & \dots & 1 \end{bmatrix}.$$

4. A method as claimed in claim 1, wherein said timing information arrives in the form of time stamped packets from the source, said local receiver generates time stamped packets based on the output of said controlled oscillator and coinciding with the arrival of time stamped packets from the source, and said time stamped packets received from the source are compared with the locally generated time stamped packets to derive said input signal.

5. A phase locked loop for recovering timing information over a packet network at a local receiver, comprising:
a controlled oscillator for generating a slave signal in response to a control signal;
a phase comparator for comparing timing information received from a remote source with the slave signal to generate a noisy input signal; and
a state feedback controller for generating a cleaned control signal from the noisy input signal;
wherein said state feedback controller includes an adaptive state estimator arranged to estimate internal states of said feedback controller, said internal states respectively representing phase and frequency offset, and a combiner for combining said computed internal states to produce said control signal; and
wherein said adaptive state estimator is a Kalman filter having a state space description given by $$x_n = F_{n-1} \cdot x_{n-1} + G_n \cdot u_n + w_n$$

and $$y(n) = H_n \cdot x_n + v_n$$

where y(n) is the measured transit time given of timing signals through the network, $F_{n-1}$ is the state transition matrix, $x_n$ is the timing recovery system state vector, $H_n$ is the measurement matrix, $G_n$ is the input matrix, $u_n$ is an input, $v_n$ represents the amount of network jitter, $w_n$ is the variance vector of the process noise.

6. A phase locked loop as claimed in claim 5, wherein said combiner is a linear combiner.

7. A phase locked loop as claimed in claim 5 having multiple input streams, wherein the state space description of the Kalman filter is given by $$y_n = \begin{bmatrix} y_1(n) \\ \dots \\ y_N(n) \end{bmatrix}$$

where $y_1(n) \dots y_N(n)$ are transit times collected from N streams, $$x_n = \begin{bmatrix} \Omega_1(n) \\ \Omega_2(n) \\ \dots \\ \Omega_N(n) \\ \alpha_n \end{bmatrix}$$

where $\Omega_1(n) \dots \Omega_N(n)$ represent the estimated phase for each stream and $\alpha_n$ is the frequency offset between the client local oscillator and the primary reference clock;

for multi stream timing packets, the measurement matrix and state transition matrix are respectively $$H_n = \begin{bmatrix} 1 & 0 & \dots & 0 & \Delta T_{x1}(n) \\ 0 & 1 & 0 & \dots & \Delta T_{x2}(n) \\ \dots & \dots & \dots & \dots & \dots \\ 0 & 0 & \dots & 1 & \Delta T_{xN}(n) \end{bmatrix}$$

and

-continued $$F_{n-1} = \begin{bmatrix} 1 & 0 & \ldots & 0 & \Delta T_{x1}(n-1) \\ 0 & 1 & 0 & \ldots & \Delta T_{x2}(n-1) \\ \ldots & \ldots & \ldots & \ldots & \ldots \\ 0 & 0 & \ldots & 1 & \Delta T_{xN}(n-1) \\ 0 & 0 & 0 & \ldots & 1 \end{bmatrix}.$$

8. Timing recovery apparatus for recovering timing information over a packet network at a local receiver, comprising:
an input for receiving remote time stamped packets from a remote source over the packet network;
a local controlled oscillator for generating a slave clock in response to a cleaned control signal;
a generator for generating local time stamped packets based on said slave clock and coinciding with the arrival of time stamped packets from the source;
a comparator for comparing said time stamped packets received from the source with the locally generated time stamped packets to derive said input signal; and
a state feedback controller for generating said cleaned control signal from said input signal;
wherein said state feedback controller includes an adaptive state estimator arranged to estimate internal states of said feedback controller, said internal states respectively representing phase and frequency offset, and a combiner for combining said computed internal states to produce said control signal; and
wherein said adaptive state estimator is a Kalman filter having a state space description given by $$x_n = F_{n-1} \cdot x_{n-1} + G_n \cdot u_n + w_n$$

and $$y(n) = H_n \cdot x_n + v_n$$

where y(n) is the measured transit time given of timing signals through the network, $F_{n-1}$ is the state transition matrix, $x_n$ is the timing recovery system state vector, $H_n$ is the measurement matrix, $G_n$ is the input matrix, $u_n$ is an input, $v_n$ represents the amount of network jitter, $w_n$ is the variance vector of the process noise.

9. A timing recovery apparatus as claimed in claim 8, wherein said combiner is a linear combiner.

10. A timing recovery apparatus as claimed in claim 8 having multiple input streams, wherein the state space description of the Kalman filter is given by $$y_n = \begin{bmatrix} y_1(n) \\ \ldots \\ y_N(n) \end{bmatrix}$$

where $y_1(n) \ldots y_N(n)$ are transit times collected from N streams, $$x_n = \begin{bmatrix} \Omega_1(n) \\ \Omega_2(n) \\ \ldots \\ \Omega_N(n) \\ \alpha_n \end{bmatrix}$$

where $\Omega_1(n) \ldots \Omega_N(n)$ represent the estimated phase for each stream and
$\alpha_n$ is the frequency offset between the client local oscillator and the primary reference clock;
for multi stream timing packets, the measurement matrix and state transition matrix are respectively $$H_n = \begin{bmatrix} 1 & 0 & \ldots & 0 & \Delta T_{x1}(n) \\ 0 & 1 & 0 & \ldots & \Delta T_{x2}(n) \\ \ldots & \ldots & \ldots & \ldots & \ldots \\ 0 & 0 & \ldots & 1 & \Delta T_{xN}(n) \end{bmatrix}$$

and $$F_{n-1} = \begin{bmatrix} 1 & 0 & \ldots & 0 & \Delta T_{x1}(n-1) \\ 0 & 1 & 0 & \ldots & \Delta T_{x2}(n-1) \\ \ldots & \ldots & \ldots & \ldots & \ldots \\ 0 & 0 & \ldots & 1 & \Delta T_{xN}(n-1) \\ 0 & 0 & 0 & \ldots & 1 \end{bmatrix}.$$

* * * * *